United States Patent
Kiishinen et al.

(10) Patent No.: US 7,161,091 B1
(45) Date of Patent: Jan. 9, 2007

(54) INTERFERENCE-SHIELDED MOBILE STATION AND CORRESPONDING METHOD AND ARRANGEMENT IN THE INTERFERENCE SHIELDING OF A MOBILE STATION

(75) Inventors: Pekka Kiishinen, Äänekoski (FI); Aleksi Sievänen, Jyväskylä (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/569,215

(22) PCT Filed: Sep. 24, 2004

(86) PCT No.: PCT/FI2004/050138

§ 371 (c)(1),
(2), (4) Date: Feb. 24, 2006

(87) PCT Pub. No.: WO2005/034600

PCT Pub. Date: Apr. 14, 2005

(30) Foreign Application Priority Data

Oct. 3, 2003 (FI) .................................. 20035178

(51) Int. Cl.
*H05K 9/00* (2006.01)
(52) U.S. Cl. .................. 174/385; 174/377; 174/51; 361/816
(58) Field of Classification Search ........... 174/385, 174/377, 51; 361/818, 800
See application file for complete search history.

(56) References Cited

U.S. PATENT DOCUMENTS

| | | | |
|---|---|---|---|
| 3,755,612 A * | 8/1973 | Yerkovich .............. | 174/373 |
| 5,446,617 A | 8/1995 | Blocher et al. ........... | 361/674 |
| 5,791,654 A * | 8/1998 | Gaines et al. ............ | 174/357 |
| 6,239,359 B1 * | 5/2001 | Lilienthal et al. ......... | 174/370 |
| 6,295,210 B1 | 9/2001 | Lanzone et al. .......... | 361/799 |
| 6,496,374 B1 | 12/2002 | Caldwell ................. | 361/709 |
| 6,501,030 B1 | 12/2002 | Parizi et al. ............. | 174/250 |
| 6,930,891 B1 * | 8/2005 | Hama et al. .............. | 361/800 |
| 2005/0162842 A1 * | 7/2005 | Muramatsu et al. ....... | 361/818 |

FOREIGN PATENT DOCUMENTS

DE      102 05 816 A1      8/2003

* cited by examiner

*Primary Examiner*—Hung V. Ngo
(74) *Attorney, Agent, or Firm*—Harrington & Smith, LLP

(57) ABSTRACT

The invention relates to an interference-shielded mobile station (10), which includes a circuit board (11), a shield (12), and electrically conductive securing members (13), separate from the shield (12), for attaching the shield (12). In the shield (12) there are openings (15) for the securing members (13). The mobile station further includes grounding elements (16) for connecting the shield (12) and the securing members (13) galvanically to the circuit board (11). Each grounding element (16) extends to the said opening (15) at the securing member (13). The grounding element (16) is at the same time in contact with the securing member (13). In addition, the grounding element (16) is part of the shield (12) for grounding both the shield (12) and the securing member (13) to the ground level of the circuit board (11). The invention also relates to a corresponding arrangement and method in the interference shielding of a mobile station (10).

12 Claims, 3 Drawing Sheets

Figure 1:
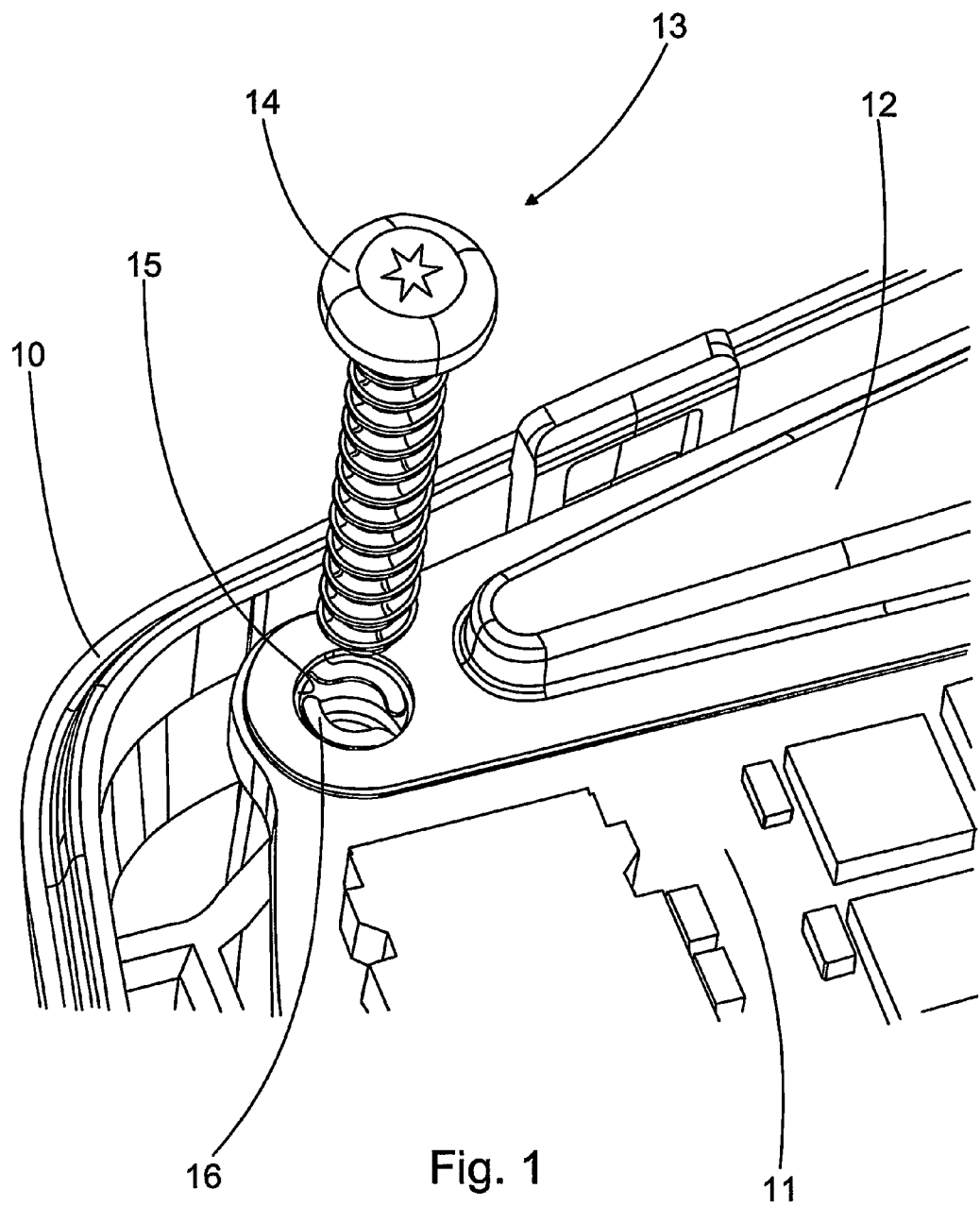

INTERFERENCE-SHIELDED MOBILE STATION AND CORRESPONDING METHOD AND ARRANGEMENT IN THE INTERFERENCE SHIELDING OF A MOBILE STATION

The present invention relates to an interference-shielded mobile station, which includes
a circuit board,
an electrically conductive shield for insulating the circuit board,
electrically conductive securing members, separate from the shield, for attaching the shield to the circuit board,
openings in the shield for the securing members, and
grounding elements for connecting the shield and the securing members galvanically to the circuit board.

In addition, the invention also relates to an arrangement and method in the interference shielding of a mobile station.

In the industry, standards have been defined concerning the electromagnetic compatibility of electrical devices, to which the abbreviation EMC (ElectroMagnetic Compatibility) is applied. In other words, devices should operate in specific conditions without, however, interfering with each other. In practice, the operation of devices causes electromagnetic radiation, which may also interfere with the operation of other devices. To prevent this interference, device components are usually encased. The cases thus prevent electromagnetic interference from leaving or entering the device. Interference shielding thus ensures that the device will operate with as little interference as possible in various radiation fields and in connection with other devices.

Encasing mobile stations in particular is problematic, as the operation of mobile stations is based on electromagnetic radiation. The construction, size, and weight of the casing are further limited by the size of mobile stations. In mobile stations, a method of interference shielding is known, according to which a shaped shield is used to insulate the electronic components of the mobile station. Several small screws secure the shield to the circuit board, so that it can be detached from the circuit board, if necessary. In addition, separate washers or conductors are used to ensure the galvanic connection of the shield, made of conductive material, to the circuit board. In order to achieve comprehensive interference shielding, the screws and other securing devices are also grounded to the circuit board.

The use of separate washers and other conductive components is expensive. In addition, they are difficult to set in place when assembling the mobile station. Despite the additional components, the galvanic connection of the securing devices, such as screws, to the circuit board is difficult to implement and grounding is often uncertain, so that the interference shielding remains imperfect. Thus, the additional components used for grounding raise manufacturing costs and complicate assembly. The additional components also increase the number of manufacturing faults in assembly, through forgetfulness and carelessness. If the shield is removed, the additional grounding components can be easily lost or broken. The grounding of structural components lying on top of each other is also problematic.

The present invention not only creates a new type of interference-shielded mobile station more simply and cheaply than before, but also achieves more reliable interference shielding. The use of the invention also creates a new kind of method and arrangement in the interference shielding of a mobile station, by means of which the drawbacks of the prior art are avoided. The characteristic features of the interference-shielded mobile station according to the invention are stated in the accompanying claim 1. Correspondingly, the characteristic features of the arrangement according to the invention are stated in claim 5 and the characteristic features of the method correspondingly in claim 10. In the invention, a part of the shield, which is also used to ground the securing members, is used to ground the shield. In that case, a reliable grounding is achieved and it is easy to implement. At the same time, the number of components required is considerably reduced, reducing costs and simplifying assembly. The design of products is also facilitated and the shield can be securely reattached after opening.

Figure 2A:
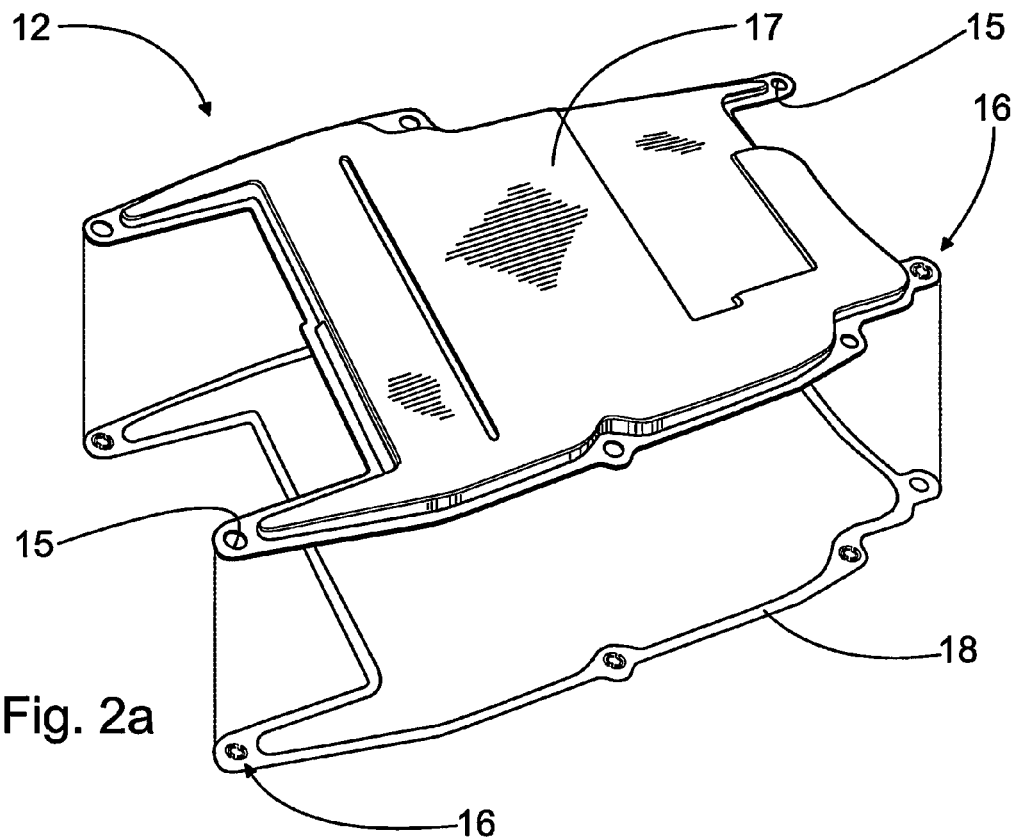
Figure 2B:
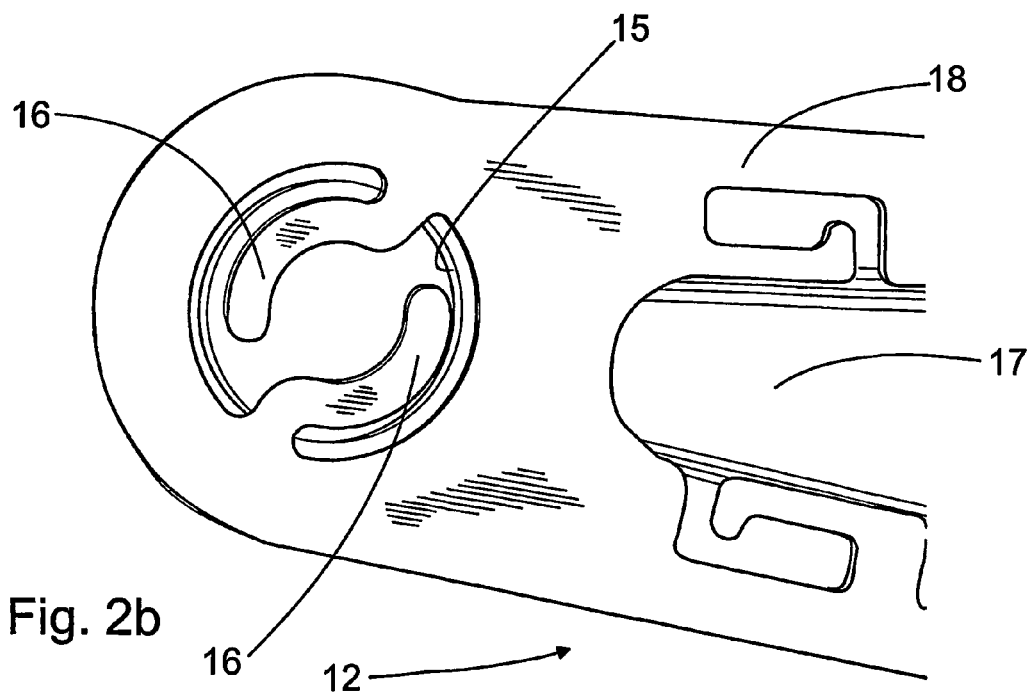
Figure 3:
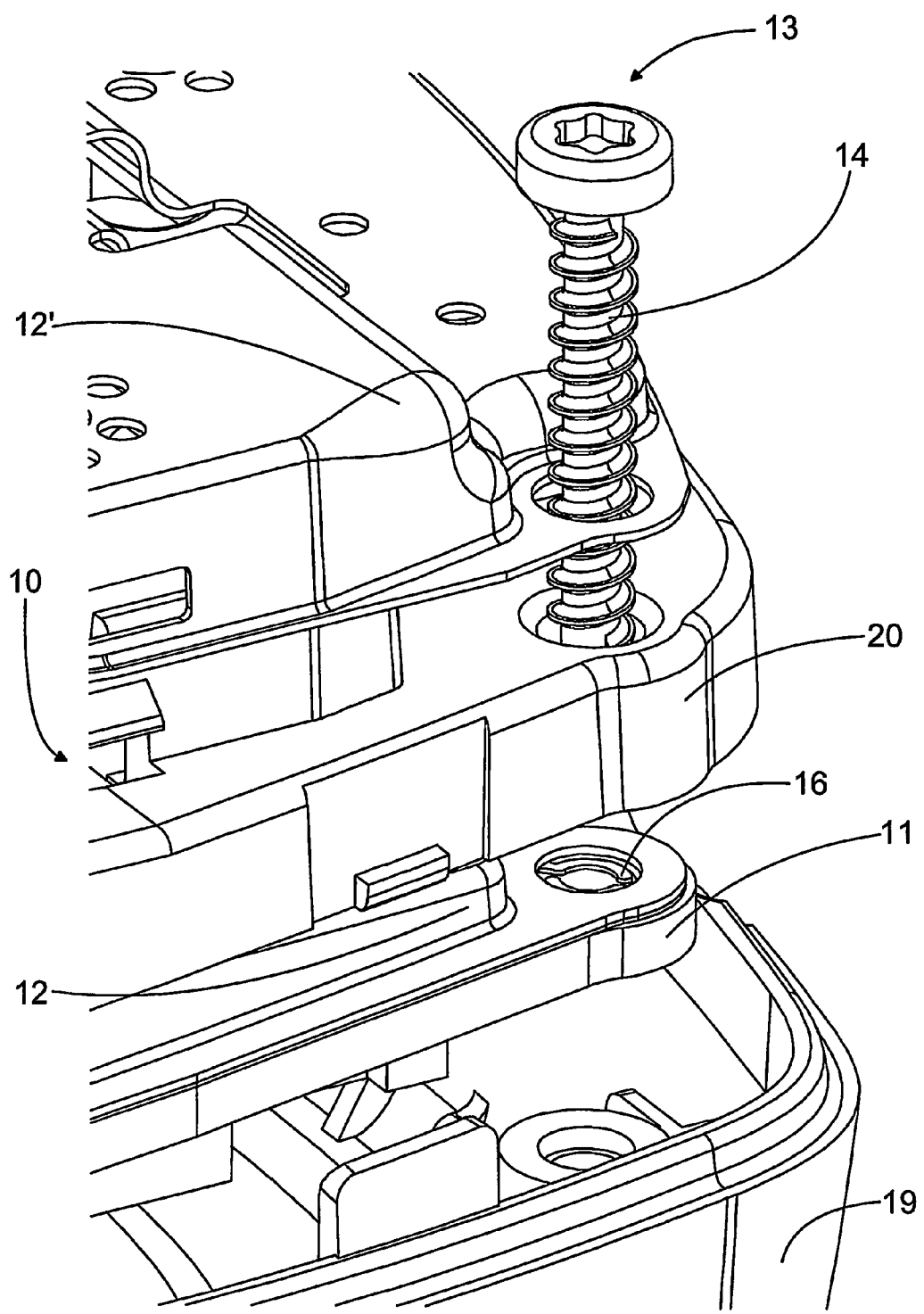

In the following, the invention is examined in greater detail with reference to the accompanying drawings showing some applications of the invention, in which FIG. 1 shows a perspective view of part of the construction of a mobile station according to the invention, FIG. 2a shows a perspective view of one shield according to the invention, FIG. 2b shows a partial enlargement of the shield according to the invention, and FIG. 3 shows a perspective view of the construction of part of a second mobile station according to the invention.

FIG. 1 shows part of mobile station 10, that is, as such, known. Here, the mobile station 10 is opened, allowing the circuit board 11 containing the electronic components to be seen clearly. To achieve electromagnetic compatibility, the circuit board 11 is at least partly insulated by means of an electrically conductive shield 12, one corner of which is shown in FIG. 1. Beneath the shield are particularly the components that cause interference, such as the microprocessor, or, correspondingly, components that are sensitive to interference. On the other hand, in practice nearly all the electronic components on the circuit board are protected by casing. The shield 12 that is partly shown in FIG. 1 is shown in its entirety in FIG. 2a. In order to achieve comprehensive interference shielding, the shield is also connected galvanically to the circuit board. The electrically conductive securing members, which are separate from the shield and are used to attach the shield, must be connected galvanically to the circuit board. In order words, the securing members too must be grounded to the same level as the circuit board, in order to maximize the interference shielding. There are suitable holes 15 in the shield 12 for the securing members 13. The securing members are often also used to attach the circuit board to the body or casing structures of the mobile station.

Thus, in general a shield is used, which is connected galvanically to the circuit board forming part of the mobile station, in order to insulate it and thus shield the mobile station from interference. The shield is attached to the circuit board using electrically conductive securing members, which are connected galvanically to the circuit board by grounding elements, when the securing member is in the opening arranged for it in the shield.

In FIG. 1, the shield 12 lies against the circuit board 11 and the securing member 13, intended to attach the shield 12, is shown in the installation position. Usually, an electrically conductive screw 14 is used as the securing member 13, allowing the shield 12 to be removed if necessary, for example, to repair the components. The screw is also used to press the shield against the circuit board, so that the necessary galvanic connection is formed between the said components. The securing member is grounded using a grounding element 16, which, according to the invention, is arranged to protrude at the securing member 13 into the aforesaid opening 15 and to be in contact with the securing member. In addition, each grounding element is formed to be not only part of the shield, but also to ground both the shield and the securing member to the ground level of the circuit board. Arranging the grounding element as part of the shield avoids having to manufacture and install separate components. This facilitates assembly and ensures the grounding of each securing member. The extension of the grounding element to the opening in the shield ensures a galvanic contact between the securing member and the grounding element and then to the circuit board. In practice, the shield with its grounding element is set on top of the circuit board, after which the securing members are simply installed. The installation and alignment of separate grounding elements are thus eliminated from the assembly. The shield can also be safely removed without breaking the grounding elements.

The grounding element is made part of the shield by forming it from the base material of the shield. In practice, the grounding elements are formed already in connection with the manufacture of the shield, which further facilitates and accelerates manufacture. The base material of a shield made from a sheet material may be too thick to form sufficiently flexible grounding elements. In FIG. 2a, the grounding elements 16 at the right-hand side of the shield 12 are arranged in a relatively thick base material. In order to avoid the problem, the shield can be arranged in two layers. In that case, the first layer, to be arranged in contact with the circuit board, can be formed as a separate conductive membrane, thus creating sufficiently flexible grounding elements. FIG. 2a shows the layers 17 and 18 of a two-layer shield separated from each other. In the figure, the lower first layer 18 is thin and thus flexible, so that it forms a kind of conductive gasket between the second layer 17 of the shield 12 and the circuit board. FIG. 2a also shows the grounding elements 16, which are thus also flexible, formed at the openings 15.

In the arrangement according to the invention, each grounding element thus extends, at the location of the securing member, to an opening, which is arranged in the shield for the securing member. Further, each grounding element is part of the shield, for grounding not only the shield, but also the securing member to the circuit board. This achieves the reliable grounding that is necessary to achieve comprehensive interference shielding. FIG. 2b shows one corner of the shield 12, seen from below. A thin, membrane-like first layer 18 covers an extensive area of the thicker second layer 17 around the opening 15, thus ensuring the grounding of the shield 12. The grounding elements 16 that protrude into the area of the opening 15 are, on the other hand, narrow, so that they are flexible and permit the use of a securing member. FIG. 2b shows two grounding elements, which are dimensioned in such a way that the thread of the screw 14 being used as the securing member will fit between the grounding elements (FIG. 1). In addition, the grounding elements 16 are arranged in such a way that they are tensioned when the screw 14 is tightened. The grounding elements thus remain undamaged. In addition, after the screw has been installed, the flexible grounding elements remain tensioned and are thus pressed against the screw. Other protrusions formed from the first layer can also be used as grounding elements. For example, there can be a small pilot hole in the first layer, which opens out through the effect of the screw. The diameter or thread of the screw will then have no effect on the reliability of the grounding.

Thus, the shield 12 shown in FIG. 2a includes two layers 17 and 18. Grounding elements 16 are arranged in the first 18 of these layers, which is arranged to be placed in contact with the circuit board 11. The first layer referred to here is also arranged to be detachable from the shield, allowing the separate layers can be easily manufactured. However, the layers together form the functional shield, to be attached to the circuit board and used as interference shielding. In this case, the thinner first layer is formed from a membrane material, its shape being adapted to conform to the counter-surface formed between the circuit board and the second layer of the shield. Thus, the thin first layer is a kind of gasket, which is aligned in place by the shape of the thicker second layer and by the securing members. In addition, the gasket-like first layer covers the whole of the aforesaid counter-surface, thus ensuring a galvanic connection. The two layers of the shield can also be arranged to be joined to each other, making the shield easy to handle. The layers can be joined, for example, by welding, or by an electrically conductive adhesive.

In order to create a galvanic connection, an electrically conductive material, for example, stainless steel, is used in the manufacture of the first layer. Stainless steel has excellent corrosion-resistance properties. In other words, stainless steel will remain unchanged in a variety of conditions and thus maintain grounding. In addition, stainless steel has good flexing characteristics, so that the grounding elements form a kind of spring. Other suitable materials are, for example, aluminium and magnesium, the flexing characteristics of which are, however, poorer than those of stainless steel.

In the two-layer shield, the thin first layer is made of a sheet material, with a thickness of about 0,1 mm, generally of 0,05–0,2 mm. Thus, the first layer becomes flexible. In addition, the thin, spring-like grounding elements arranged in the shield, at the openings for the securing members, lie suitably between the securing members and the circuit board, without, however, reducing the grip of the securing members. The thin sheet material is easily worked. In practice, the openings for the securing members and grounding elements can be formed with a single tool, for example, with a punch. In other words, a part of the sheet material is removed by punching, thus forming both an opening and at least one grounding element. The grounding element is thus a permanent part of the shield, or at least of one of its layers.

By means of the method and arrangement described above, comprehensive shielding is created in a mobile station. In the mobile station, the circuit board is at least partly insulated by the shield. The grounding elements are used to connect the separate securing members, placed in the openings of the shield, galvanically to the circuit board. According to the invention, each grounding element extends in the said opening at the securing member. In addition, each grounding element is part of the shield. Thus, in addition to the shield, each securing member will be reliably connected galvanically to the circuit board, achieving comprehensive interference shielding.

In one embodiment of the mobile station, the shield includes two layers. Of these layers, the first layer, which is in contact with the circuit board, is formed from a flexible membrane material. The grounding elements will then be flexible and ground the entire shield and securing members to the circuit board. In addition, the first layer of membrane material is separate, so that it is easily manufactured. The first layer is also shaped in such a way that, when it is between the circuit board and the shield, it essentially covers the entire counter-surface between them. This achieves reliable grounding between the different components, thus creating comprehensive interference shielding for the mobile station.

In the first embodiment, the shield is attached directly to the circuit board, so that an electrically conductive screw would create grounding at least partly through its head, without the grounding elements according to the invention. FIG. 3 shows a second embodiment of a mobile station, in which there are additional components on top of the shield. Generally, the mobile station still includes a electrically non-conductive component, on top of which a second shield is fitted, placed on top of the shield. In addition, the component and the second shield are secured to the mobile station using the said securing members, in order to connect the second shield too to the ground level of the circuit board. In FIG. 3, the rear cover 19 of the mobile station 10 is shown at the bottom, followed by the circuit board 11, with the first conductive shield 12 against its ground level. In this case, the non-conductive component is the display frame 20, on top of which is yet another conducive shield 12' protecting the display frame 20. According to the invention, all these structures and components are secured to each other using a conductive securing member 13, which in this case is a screw 14. The same reference numbers are used for functionally similar components.

Without the grounding elements 16 according to the invention, the securing member 13 of conductive material would remain separate from the ground level of the circuit board 11, as would the second shield 12'. However, according to FIG. 3, the securing member 13 is in contact with the grounding elements 16, while simultaneously using its head to ground the second shield 12'. Thus, all the electrically conductive components are grounded at the same time, without separate parts. In other words, at least one grounding element, by means of which the conductive securing element is grounded to the ground level of the circuit board, is integrated in the conductive shield on top of the circuit board. At the same time, other possible conductive shields that are separate from the ground level of the circuit board are connected galvanically to the same potential. If necessary, grounding elements according to the invention can be arranged in the second shield too.

The interference shielding according to the invention and the grounding that it requires can be implemented simply. Especially the conductive layer made from thin sheet material can be easily and cheaply worked to form a flexible gasket, which has, in addition, grounding elements. In addition, the grounding elements reliably contact each of the securing members. Thanks to the grounding elements belonging to the shield, the shield can be detached from, and then reattached to the circuit board.

The invention claimed is:

1. An interference-shielded mobile station (10), which includes
    a circuit board (11),
    an electrically conductive shield (12) for insulating the circuit board (11),
    electrically conductive securing members (13), separate from the shield (12), for attaching the shield (12) to the circuit board (11),
    openings (15) in the shield (12) for the securing members (13), and
    grounding elements (16) for connecting the shield (12) and the securing members (13) galvanically to the circuit board (11),
characterized in that each grounding element (16) extends to the said opening (15) at the securing member (13) and is at the same time in contact with the securing member (13), and each grounding element (16) is part of the shield (12) for grounding both the shield (12) and the securing member (13) to the ground level of the circuit board (11).

2. A mobile station according to claim 1, characterized in that the shield (12) includes two layers (17, 18), of which the first layer (18), to be arranged in contact with the circuit board (11), is formed of a flexible membrane material.

3. A mobile station according to claim 2, characterized in that the first layer (18) of membrane material is separate and it is arranged between the circuit board (11) and the second layer (17) of the shield (12), essentially over the entire counter-surface between them.

4. A mobile station according to any of claims 1–3, characterized in that the mobile station further includes an electrically non-conductive component (20) set on top of the shield (12), on top of which a second shield (12') is fitted, which component (20) and second shield (12') are secured, using the said securing member (13), to the mobile station and also to the ground level of the circuit board (11).

5. An arrangement in the interference shielding of a mobile station, in which arrangement grounding element are arranged between the circuit board (11) belonging to the mobile station (10) and the electrically conductive shield (12) intended to insulate it, for connecting the shield (12) and the securing members (13) belonging to the mobile station (10) and fitted into openings (15) arranged in the shield (12), galvanically to the circuit board (11), characterized in that each grounding element (16) is arranged to protrude into the said opening (15) at the securing member (13) as well as being at the same time in contact with the securing member (13), and each grounding element (16) is part of the shield (12) for grounding both the shield (12) and the securing member (13) to the ground level of the circuit board (11).

6. An arrangement according to claim 5, characterized in that the shield (12) includes two layers (17, 18), grounding elements (16) being arranged in the layer (18) to be arranged in contact with the circuit board (11).

7. An arrangement according to claim 6, characterized in that the first layer (18) arranged to be detachable from the shield (12), or arranged permanently in the shield (12) is formed from a membrane material and the shape of the first layer (18) is arranged to conform to the counter-surface formed between the circuit board (11) and the second layer (17) of the shield (12).

8. An arrangement according to claim 5 or 6, characterized in that the material of the said first layer (18) is an electrically conductive material and the thickness of the material is 0,05–0,2 mm, for forming at least one flexible grounding element (16).

9. An arrangement according to any of claims 5–8, characterized in that the grounding elements (16) are arranged in the shield (12) at the openings (15) arranged for the securing members (13) and to lie between the securing members (13) and the circuit board (11).

10. A method in the interference shielding of a mobile station, in which method
    a shield (12) is used, which is connected galvanically to the circuit board (11) belonging to the mobile station (10), in order to insulate the circuit board (11),
    the shield is attached to the circuit board (11) using electrically conductive securing members (13), and
    the securing members (13) are connected galvanically to the circuit board (11) using grounding elements (16), the securing member (13) being in an opening (15) arranged in the shield (12) for the securing member (13), characterized in that each grounding element (16) is arranged at the securing member (13) to extend to the said opening (15) and at the same time to be in contact with the securing member (13), and each grounding element (16) is formed to be part of the shield (12), in order to ground both the shield (12) and the securing member (13) to the ground level of the circuit board (11).

11. A method according to claim 10, characterized in that each grounding element (16) is formed from the base material of the shield (12).

12. A method according to claim 11, characterized in that the base material is arranged to be in two layers, the first layer (18) of which arranged in contact with the circuit board (11) is formed to be a separate conductive membrane, in order to form the flexible grounding elements (16).

* * * * *

UNITED STATES PATENT AND TRADEMARK OFFICE
CERTIFICATE OF CORRECTION

PATENT NO. : 7,161,091 B1
APPLICATION NO. : 10/569215
DATED : January 9, 2007
INVENTOR(S) : Pekka Kiiskinen et al.

It is certified that error appears in the above-identified patent and that said Letters Patent is hereby corrected as shown below:

On The Title Page: Item (75)
Inventors: Please delete "Pekka Kiishinen" and replace it with --Pekka Kiiskinen--.
In Claim 8: Column 6, line 48, after "Claim 5" delete "or 6".
In Claim 9: Column 6, line 53, delete "any of claims 5-8," and insert --claim 5,-- as it appears.

Signed and Sealed this

Fifteenth Day of May, 2007

JON W. DUDAS
*Director of the United States Patent and Trademark Office*